US012753068B2

(12) United States Patent
Arena et al.

(10) Patent No.: US 12,753,068 B2
(45) Date of Patent: Oct. 6, 2026

(54) ENGINEERED SUBSTRATES, FREE-STANDING SEMICONDUCTOR MICROSTRUCTURES, AND RELATED SYSTEMS AND METHODS

(71) Applicant: Lawrence Semiconductor Research Laboratory, Inc., Tempe, AZ (US)

(72) Inventors: Chantal Arena, Mesa, AZ (US); Nupur Bhargava, Hillsboro, OR (US); Alec Fischer, Chandler, AZ (US)

(73) Assignee: Lawrence Semiconductor Research Laboratory, Inc., Tempe, AZ (US)

( * ) Notice: Subject to any disclaimer, the term of this patent is extended or adjusted under 35 U.S.C. 154(b) by 670 days.

(21) Appl. No.: 18/064,633

(22) Filed: Dec. 12, 2022

(65) Prior Publication Data

US 2024/0190694 A1 Jun. 13, 2024

(51) Int. Cl.
*B81B 3/00* (2006.01)
*B81C 1/00* (2006.01)

(52) U.S. Cl.
CPC ........ *B81B 3/0021* (2013.01); *B81C 1/00595* (2013.01); *B81B 2203/0118* (2013.01); *B81B 2203/0127* (2013.01)

(58) Field of Classification Search
CPC ........... B81B 3/0021; B81B 2203/0118; B81B 2203/0127; B81C 1/00595; B81C 1/00476; B81C 1/00666
See application file for complete search history.

(56) References Cited

U.S. PATENT DOCUMENTS

| | | | | |
|---|---|---|---|---|
| 10,571,681 | B2 | 2/2020 | Meier et al. | |
| 11,923,313 | B2 | 3/2024 | Costa et al. | |
| 2001/0003269 | A1* | 6/2001 | Wu | H10P 14/2905 117/97 |
| 2002/0068393 | A1* | 6/2002 | Fitzgerald | H10D 30/021 257/E21.409 |
| 2002/0081861 | A1 | 6/2002 | Robinson et al. | |
| 2004/0183214 | A1 | 9/2004 | Partridge et al. | |
| 2005/0077511 | A1* | 4/2005 | Fitzergald | H10D 30/051 257/E21.445 |
| 2006/0147169 | A1 | 7/2006 | Sugita et al. | |
| 2007/0086502 | A1 | 4/2007 | Burns | |

(Continued)

FOREIGN PATENT DOCUMENTS

TW 201800326 A 1/2018

OTHER PUBLICATIONS

International Search Report for Application No. PCT/US2022/081365 dated Sep. 4, 2023, 3 pages.

(Continued)

*Primary Examiner* — Moazzam Hossain
(74) *Attorney, Agent, or Firm* — Quarles & Brady LLP; Yakov S. Sidorin

(57) ABSTRACT

An engineered substrate comprises a base substrate, a monocrystalline sacrificial intermediate layer epitaxially grown over the base substrate, and a monocrystalline top layer epitaxially grown over the monocrystalline sacrificial intermediate layer. The engineered substrate may be used to form a free-standing microstructure comprising the engineered substrate by removing at least a portion of the intermediate layer from between the base substrate and the top layer.

17 Claims, 8 Drawing Sheets

(56) References Cited

U.S. PATENT DOCUMENTS

| | | | | |
|---|---|---|---|---|
| 2008/0311751 | A1* | 12/2008 | Laermer | B81C 1/00476 257/E21.299 |
| 2011/0298083 | A1 | 12/2011 | Yoneda | |
| 2019/0013200 | A1* | 1/2019 | Lagally | C30B 25/02 |
| 2023/0260921 | A1 | 8/2023 | Costa et al. | |
| 2024/0038582 | A1 | 2/2024 | Chetry et al. | |

OTHER PUBLICATIONS

International Written Opinion for Application No. PCT/US2022/081365 dated Sep. 4, 2023, 5 pages.

Taiwanese Office Action for Application No. 11220742940 dated Jul. 31, 2023, 13 pages.

Hollander et al., "Wet Chemical Etching of Si, Si1-xGex, and Ge in HF:H2O2:CH3COOH", Journal of The Electrochemical Society, 157 (6), (2010) pp. H643-H646.

Houghton, "Strain relaxation kinetics in Si1-x Ge x /Si heterostructures", Journal of Applied Physics vol. 70, No. 4, (Aug. 1991) pp. 2136-2151.

* cited by examiner

ENGINEERED SUBSTRATES, FREE-STANDING SEMICONDUCTOR MICROSTRUCTURES, AND RELATED SYSTEMS AND METHODS

TECHNICAL FIELD

Embodiments of the present disclosure generally relate to engineered substrates. In particular, embodiments of the present disclosure relate to engineered semiconductor substrates, free-standing semiconductor microstructures, and related systems and methods.

BACKGROUND

Free-standing microstructures may be formed to interface with Micro-Electro-Mechanical System (MEMS) components, such as sensors, accelerometers, inductors, etc. Free-standing microstructures may be formed through processes, such as surface micromachining. Surface micromachining processes frequently involve selectively removing a sacrificial intermediate layer from between other layers of an engineered substrate to form voids between the other layers. The free-standing microstructures resulting from the formation of the voids may form electronic or mechanical components. Surface micro-machined components may be smaller compared to components formed through other micro-machining methods.

BRIEF SUMMARY

Some embodiments of the present disclosure may include an engineered substrate. The engineered substrate may include a first silicon layer, a second layer over the first silicon layer, and a third layer over the second layer. The second layer may include silicon-germanium (SiGe). The third layer may include a monocrystalline silicon film.

Other embodiments of the present disclosure may include a free-standing microstructure. The free-standing microstructure may include a first silicon layer, a second silicon layer, and an intermediate layer. The second silicon layer may include a monocrystalline silicon film. The intermediate layer may be between the first silicon layer and the second silicon layer. The intermediate layer may include a silicon-based or germanium-based material having a greater or smaller lattice constant than the first silicon layer or the second silicon layer. The intermediate layer may have a composition that varies across a thickness of the intermediate layer. The composition may vary continuously across the thickness of the intermediate layer. In other embodiments, the composition may vary in a stepwise manner across the thickness of the intermediate layer. In such embodiments, the intermediate layer may be characterized as comprising a plurality of individual sublayers, each having a different composition or a different composition profile than the immediately adjacent sublayers of the plurality. The intermediate layer may have any number of such sublayers, such as from two (2) to two thousand (2,000) or more such sublayers. The intermediate layer may comprise a sacrificial material. Thus, at least some regions of the intermediate layer may be subsequently removed, and the intermediate layer may further include one or more cavities wherein at least a portion of the silicon-based or germanium-based material is absent between the first silicon layer and the second silicon layer.

Other embodiments of the present disclosure may include a method of forming a free-standing microstructure. The method includes forming an engineered substrate. Forming the engineered substrate may include growing an intermediate layer of monocrystalline silicon- or germanium-based material over a silicon substrate. The silicon- or germanium-based material may have a lattice constant different from a lattice constant of the silicon substrate. Growing the intermediate layer of monocrystalline silicon- or germanium-based material may comprise varying a composition of the intermediate layer across a thickness of the intermediate layer. The composition may be varied continuously across the thickness of the intermediate layer. In other embodiments, the composition may be varied in a stepwise manner across the thickness of the intermediate layer. In such embodiments, growing the intermediate layer may be characterized as sequentially growing a plurality of individual sublayers one on top of the other, each sublayer formulated to have a different composition or a different composition profile than the immediately adjacent sublayers of the plurality. Growing the intermediate layer may involve growing any number of such sublayers, such as from two (2) to two thousand (2,000) or more such sublayers. Forming the engineered substrate may further include growing a monocrystalline silicon film over the intermediate layer of monocrystalline silicon- or germanium-based material. The intermediate layer may comprise a sacrificial material. Thus, at least some regions of the intermediate layer may be subsequently removed. For example, the method may further include forming an opening through the monocrystalline silicon film and the intermediate layer of monocrystalline silicon- or germanium-based material. The method may also include removing at least a portion of the intermediate layer of monocrystalline silicon- or germanium-based material from between the monocrystalline silicon film and the silicon substrate.

BRIEF DESCRIPTION OF THE DRAWINGS

While the specification concludes with claims particularly pointing out and distinctly claiming embodiments of the present disclosure, the advantages of embodiments of the disclosure may be more readily ascertained from the following description of embodiments of the disclosure when read in conjunction with the accompanying drawings in which:

DETAILED DESCRIPTION

The illustrations presented herein are not meant to be actual views of any particular substrate, microstructure, or component thereof, but are merely idealized representations employed to describe illustrative embodiments. The drawings are not necessarily to scale.

As used herein, the term "substantially" in reference to a given parameter means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, at least about 99% met, or even at least about 100% met. In another example, a material being substantially free of a parameter or element may be at least about 90% free, at least about 95% free, at least about 99% free, or even 100% free of the parameter or element.

As used herein, relational terms, such as "first," "second," "top," "bottom," etc., are generally used for clarity and convenience in understanding the disclosure and accompanying drawings and do not connote or depend on any specific preference, orientation, or order, except where the context clearly indicates otherwise.

As used herein, the term "and/or" means and includes any and all combinations of one or more of the associated listed items.

Free-standing microstructures may be formed by selectively etching a sacrificial layer and depositing thin films to form free-standing microstructures. For example, a sacrificial layer may be formed over a substrate. A top layer may be formed over the sacrificial layer. The sacrificial layer may then be selectively removed in a manner causing the top layer to form a floating cantilever or membrane that can move freely over the substrate.

Common materials used in forming free-standing microstructures are polysilicon and silicon oxides (e.g., $SiO_2$). Several additional process steps and associated pieces of equipment are required to grow or deposit oxides and to deposit the polysilicon. Polysilicon layers formed over oxide layers may have grain boundaries and plastic deformations. The grain boundaries may affect signals traveling through the polysilicon layer. To form accurately functioning MEMS devices, the grain boundaries may have to be controlled within the wafer and at wafer to wafer interfaces. Furthermore, polycrystalline materials, such as polysilicon, may have a high surface roughness that may need to be polished requiring additional processing steps and equipment.

Figure 1:
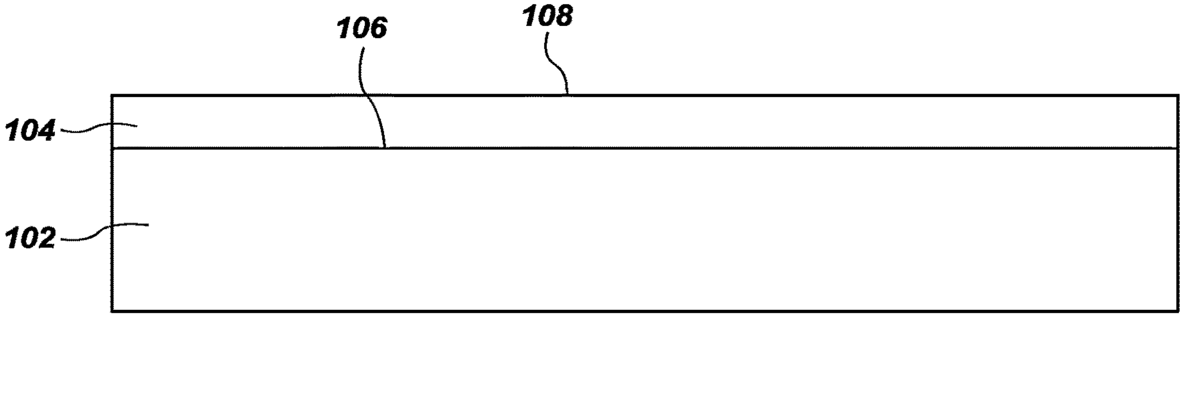
FIGS. 1-4C illustrate schematic views of process steps for forming an engineered substrate in accordance with embodiments of the present disclosure.

FIGS. 1-6 illustrate process steps of forming a free-standing microstructure in accordance with embodiments of the present disclosure. First, a sacrificial intermediate layer 104 may be formed over a base substrate 102, as illustrated in FIG. 1. For example, the sacrificial intermediate layer 104 may be grown directly on a top surface 106 of the base substrate 102, such as through a deposition process. The base substrate 102 may be any of those employed in the semiconductor industry, such as a silicon substrate, a germanium substrate, a glass substrate, silicon carbide substrate, a sapphire substrate, a gallium arsenide substrate or a plastic substrate (e.g., a polyethylene terephthalate substrate), for example.

The sacrificial intermediate layer 104 may be formed by growing (e.g., epitaxially) the sacrificial intermediate layer 104 on the top surface 106 of the base substrate 102. The sacrificial intermediate layer 104 may be formed from a material that may be selectively removed without removing adjacent materials. In some embodiments, the sacrificial intermediate layer 104 may be a material from which monocrystalline silicon (e.g., single-crystal silicon) may be epitaxially grown thereon. For example, the sacrificial intermediate layer 104 may be formed from a silicon based monocrystalline material. In some embodiments, the sacrificial intermediate layer 104 may be formed from a monocrystalline silicon germanium (SiGe) material, on which monocrystalline silicon may be epitaxially grown. The SiGe material may be represented as the formula $Si_{1-x}Ge_x$, where "X" represents the mole fraction percentage of Ge in the SiGe alloy. The molar fraction percentage of Ge ("X") may be between about 1% and about 100%, such as between about 20% and about 70%, or between about 30% and about 50%. In other embodiments, the silicon-based monocrystalline material may be Silicon Phosphide (SiP), Silico Carbide (SiC), or Silicon Boride (SiB). The sacrificial intermediate layer 104 may have a thickness of between about 0.1 micrometers (m) and about 10 m, such as between about 0.5 m and about 2 m, or about 1 m.

The composition of the sacrificial intermediate layer 104 may be adjusted to meet application specific criterion, such as etching rate, strain relaxation, etc. For example, where the sacrificial intermediate layer 104 is formed from SiGe, different concentrations of germanium (Ge) in the SiGe may result in different performance characteristics of the resulting SiGe, as described in more detail below with respect to FIG. 7 and FIG. 8. In some embodiments, the SiGe may have concentrations of Ge of greater than about 20%, such as between about 20% and about 100%, or between about 20% and about 70%, or between about 20% and about 60%.

Figure 2A:
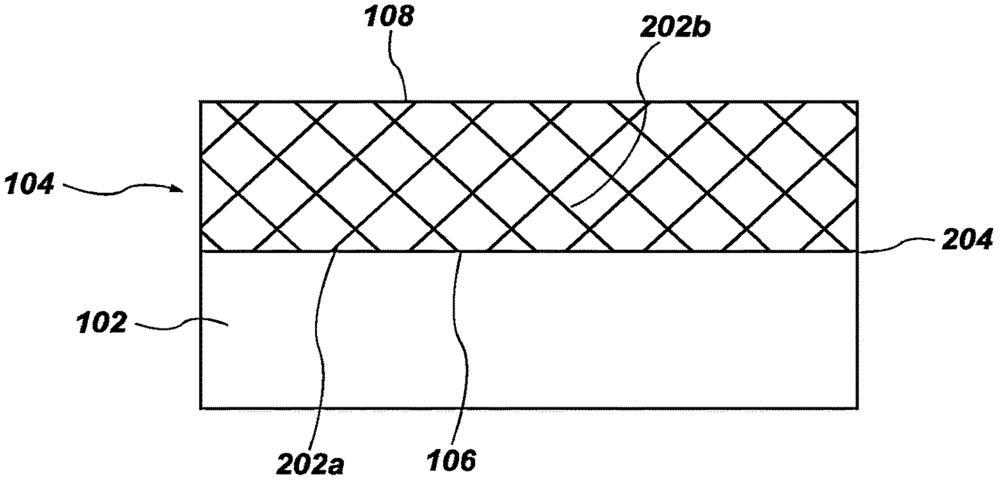

As the sacrificial intermediate layer 104 is formed the sacrificial intermediate layer 104 may relax, such as by releasing residual strain by forming dislocations 202*a*, 202*b*, as schematically illustrated in FIG. 2A. The dislocations 202*a*, 202*b* may be misfit dislocations 202*a* and/or threading dislocations 202*b*. The dislocations 202*a*, 202*b* may be formed when the sacrificial intermediate layer 104 is grown beyond a critical thickness of the sacrificial intermediate layer 104. The critical thickness may be a thickness below which dislocations are limited and above which dislocations begin to form relaxing residual strain in the sacrificial intermediate layer 104. Several factors, such as growth temperature, material composition, etc., may combine to determine the critical thickness of each layer. The factors and a method of determining the respective critical thicknesses are described in D. C. Houghton, Strain Relaxation Kinetics In $Si_{1-x}Ge_x$/Si heterostructures, AIP Journal Of Applied Physics, 70, 2136 (1991), the disclosure of which is incorporated herein in its entirety by this reference.

The critical thickness may be at least partially defined by a lattice constant of the sacrificial intermediate layer 104, which may be driven by a composition of the sacrificial intermediate layer 104. For example, as the Ge concentration of the SiGe material increases, the lattice constant of the SiGe material may also increase, thereby increasing a mismatch between the lattice constant of the base substrate 102 and the lattice constant of the sacrificial intermediate layer 104. As the lattice constant of the sacrificial intermediate layer 104 increases the critical thickness of the sacrificial intermediate layer 104 may decrease, as described in further detail below with respect to FIG. 8. The growth temperature may also affect the critical thickness of the sacrificial intermediate layer 104.

When the thickness of the sacrificial intermediate layer 104 is below the critical thickness the sacrificial intermediate layer 104 may remain strained to conform the lattice structure to the base substrate 102. In other words, the sacrificial intermediate layer 104 may include residual strain throughout the sacrificial intermediate layer 104 as molecular forces in the base substrate 102 force the lattice structure of the sacrificial intermediate layer 104 to conform to the smaller lattice structure of the base substrate 102. Once the sacrificial intermediate layer 104 is grown beyond the critical thickness, dislocations 202*a* and 202*b* may begin to form throughout the sacrificial intermediate layer 104 relaxing the residual strain in the sacrificial intermediate layer 104 and allowing the lattice structure in the sacrificial intermediate layer 104 to grow without conforming to the lattice structure of the base substrate 102.

Relaxation of the sacrificial intermediate layer 104 may be accompanied by formation of dislocations 202*a* along an interface 204 between the sacrificial intermediate layer 104 and the top surface 106 of the base substrate 102. Dislocations 202*a* may be misfit dislocations formed by glide of dislocation loops. For each misfit dislocation 202*a* there may be at least two threading dislocation arms 202*b* extending through the sacrificial intermediate layer 104 to the top surface 108 of the sacrificial intermediate layer 104. The density of the threading dislocations 202*b* may be less than about $10^9$ $cm^{-2}$.

As the dislocations 202*a* relax the compressive strain in the sacrificial intermediate layer 104, a surface roughness of the sacrificial intermediate layer 104 may increase. Releasing the compressive strain through the dislocations 202*a* may substantially increase the deformation of the top surface 108 of the sacrificial intermediate layer 104. Surface deformations of the top surface 108 of the sacrificial intermediate layer 104 may translate through subsequent layers creating deformations which may manifest as surface roughness for a final top layer of the assembly. Thus, reducing the surface deformations of the top surface 108 of the sacrificial intermediate layer 104 may reduce surface roughness of a final layer of the assembly.

The sacrificial intermediate layer 104 may be formed in multiple layers. For example, a first layer 206 may be formed until the desired dislocations 202*a*, 202*b* are formed. The first layer 206 may be formed at a temperature between about 500° C. and about 700° C., such as about 600° C. In some cases, the sacrificial intermediate layer 104 may go through an annealing process after the first layer 206 is formed. For example, the first layer 206 may be heated to a higher temperature than the temperature at which the first layer 206 is formed, such as a temperature between about 700° C. and about 1000° C., or between about 900° C. and about 1000° C. The thermal energy provided by the annealing process may cause the dislocations 202*a*, 202*b* to propagate through the first layer 206. In some embodiments, the annealing process may be a separate heating process. In other embodiments, the annealing process may be carried out by forming (e.g., epitaxially growing) a second layer 208 over the first layer 206 at a higher temperature than the temperature at which the first layer 206 was formed.

Figure 2B:
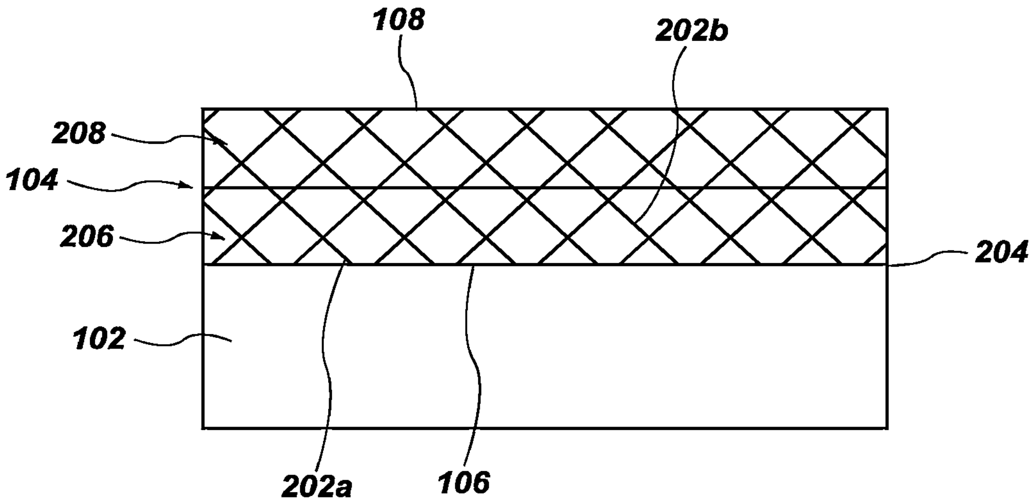

As illustrated in FIG. 2B, the second layer 208 may be grown over the first layer 206. The second layer 208 may be grown at a temperature greater than the temperature at which the first layer 206 was grown. For example, the second layer 208 may be grown at a temperature between about 650° C. and about 800° C., such as about 700° C. The second layer 208 may have substantially less density of dislocations 202*a*, 202*b*. The second layer 208 may be configured to substantially trap the dislocations 202*a*, 202*b* of the first layer 104. In some embodiments, the sacrificial intermediate layer 104 may go through a second anneal process after the second layer 208 is formed. In other embodiments, the sacrificial intermediate layer 104 may not go through any additional anneal processes after the second layer 208 is formed.

Figure 2C:
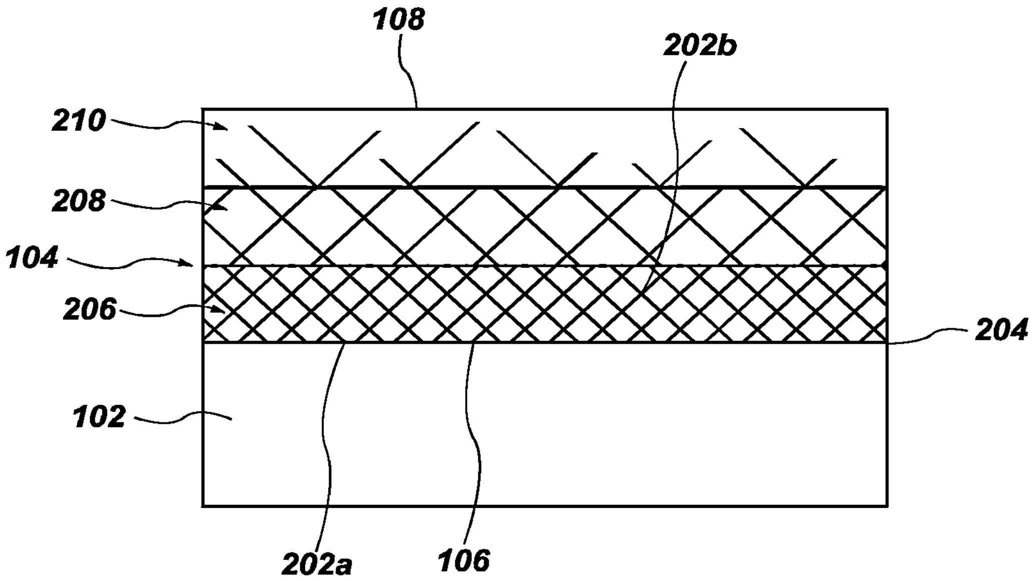

Another third layer 210 may be grown at a high temperature, as illustrated in FIG. 2C. The third layer 210 may be grown at substantially the same temperature as the second layer 208. Growing the second layer 208 and third layer 210 may provide a surface having a lower root mean square (RMS) roughness than the first layer 206. The second layer 208 and third layer 210 may also have substantially less density of dislocations 202*a*, 202*b*, which may further contribute to a lower RMS roughness.

Figure 2D:
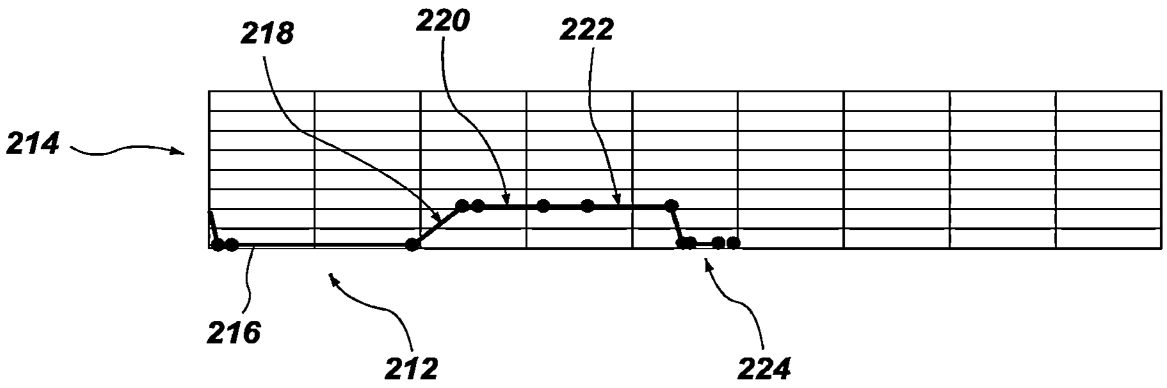

FIG. 2D illustrates a graph of the temperature 214 over time 212 of representative of a process of forming the multiple layers of the sacrificial intermediate layer 104. A first layer 216 may be formed at a first temperature for a first period of time. For example, the first period of time may be between about 500 seconds and about 1000 seconds, such as between about 800 seconds and about 900 seconds, or about 860 seconds. After the first layer 216 is formed, the temperature may rise 218 to a second higher temperature for the formation of the second layer 220. The temperature rise 218 may cause an at least partial anneal within the first layer 216 propagating any dislocations throughout the first layer 216 and substantially releasing any residual strain. The second layer 220 may be grown at the second temperature for a second period of time. The second period of time may be between about 100 seconds and about 1000 seconds, such as between about 200 seconds and about 500 seconds, or about 320 seconds. A third layer 222 may also be grown subsequent to the second layer 220 at a third temperature. In some embodiments, the third temperature may be substantially the same as the second temperature as illustrated in FIG. 2D. In other embodiments, the third temperature may be a different temperature than the second temperature. If the third temperature is greater than the second temperature, a second partial anneal may be occur during the temperature change from the second temperature to the third temperature. The third layer 222 may be formed during a third time period. The third time period may be between about 200 seconds and about 1000 seconds, such as between about 300 seconds and about 500 seconds, or about 400 seconds. After the third layer 222 is grown the temperature may be reduced to an unload temperature 224.

Figure 2E:
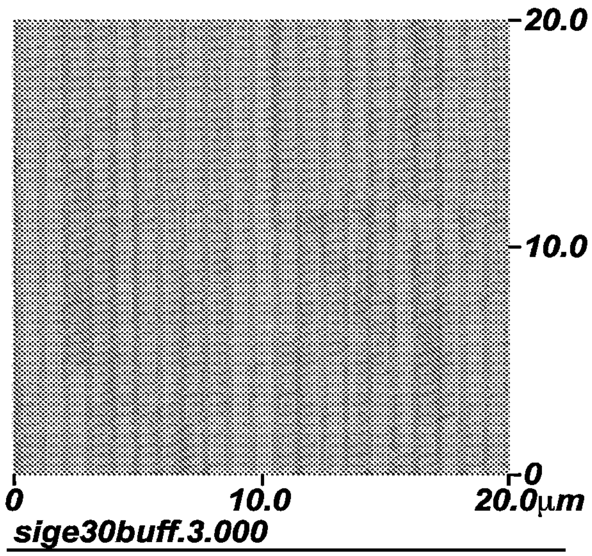

FIG. 2E illustrates an Atomic Force Microscopy (AFM) image of a top surface of the sacrificial intermediate layer 104 after all three layers have been formed. The surface may have a maximum elevation change of less than about 30 nm, such as less than about 20 nm, or less than about 15 nm. The surface may have an RMS roughness of less than about 10 nm, such as less than about 5 nm, or less than about 2 nm.

In some embodiments, the sacrificial intermediate layer 104 may have a composition that varies across a thickness of the sacrificial intermediate layer 104. In some embodiments, the composition may vary in a stepwise manner across the thickness of the intermediate layer 104. In such embodiments, the sacrificial intermediate layer 104 may comprise a plurality of individual sublayers, such as layers 206, 208, and 210, each having a different composition or a different composition profile than the immediately adjacent sublayers of the plurality. Although the sacrificial intermediate layer 104 illustrated in the embodiment of FIG. 2C has three sublayer 206, 208, 210, the sacrificial intermediate layer 104 may have any number of such sublayers, such as from two (2) to two thousand (2,000) or more such sublayers.

In other embodiments, the composition of the sacrificial intermediate layer 104 may vary continuously across the thickness of the sacrificial intermediate layer 104. For example, during epitaxial growth of the sacrificial intermediate layer 104, the relative concentrations of the precursor gases introduced into the growth chamber may be continuously varied over the duration of the deposition process such that the composition of the sacrificial intermediate layer 104 continuously varies across the thickness of the sacrificial intermediate layer 104. The temperature within the growth chamber could also be varied (continuously increasing, continuously decreasing, stepwise increasing, stepwise decreasing, etc.) over the duration of the growth process so as to advantageously affect the characteristics of the sacrificial intermediate layer 104, such as the concentration of defects therein, and the smoothness of the exposed surface of the sacrificial intermediate layer 104.

Figure 3:
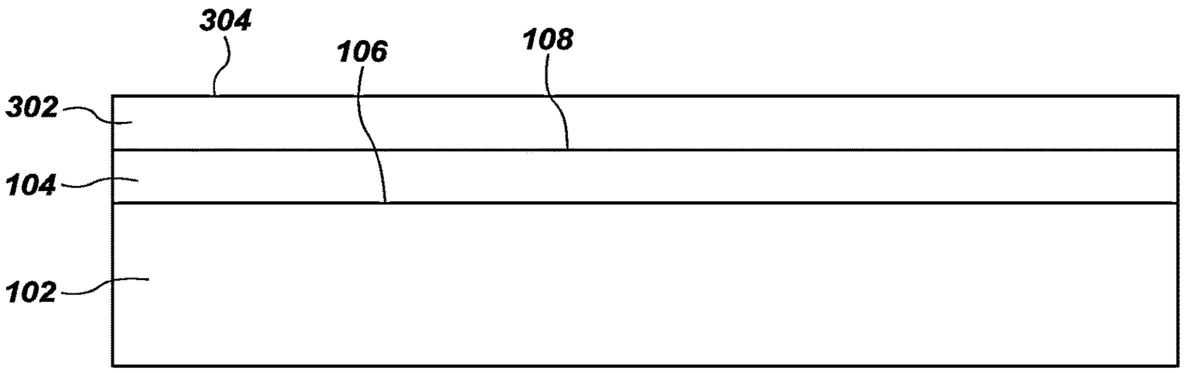
Figure 4A:
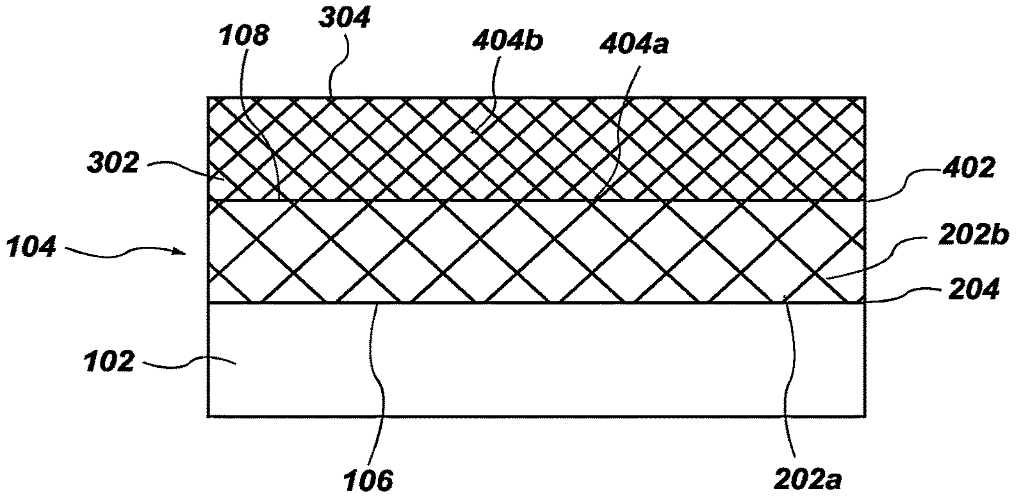

After the sacrificial intermediate layer 104 is formed over the base substrate 102, a top layer 302 may be formed over the sacrificial intermediate layer 104, as illustrated in FIGS. 3 and 4A. For example, the top layer 302 may be grown directly on the top surface 108 of the sacrificial intermediate layer 104, such as through a deposition process.

The top layer 302 may be formed by growing the top layer 302 on the top surface 108 of the sacrificial intermediate layer 104. The top layer 302 may be grown epitaxially from Si atoms generated from the reduction or decomposition of a precursor gas, such as dichlorosilane (DCS) or trichlorosilane (TCS). Growing the top layer 302 with DCS may result in an RMS surface roughness of the top layer 302 between about 5 nm and about 15 nm.

The top layer 302 may be formed from a monocrystalline material, such as monocrystalline silicon (e.g., single-crystal silicon). Monocrystalline materials may have surfaces that are substantially smoother (e.g., atomistically smooth) than polycrystalline materials. In some embodiments, the top layer 302 may be grown to a thickness of between about 0.1 micrometers (m) and about 100 m, such as between about 0.4 m and about 75 m, or between about 1 m and about 50 m, or about 15 m.

After the top layer 302 is formed the top layer 302 may relax similarly to the sacrificial intermediate layer 104 described above, by releasing residual strain by forming dislocations 404*a*, 404*b* or by the pre-existing threading dislocations 202*b* from the sacrificial intermediate layer 104, as illustrated in FIG. 4. The density of the threading dislocations 404*b* may be about two times the density of the misfit dislocations 202*b*, such as on the order of about $2\times10^{8}$ $cm^{-2}$ (e.g., less than about $10^{9}$ $cm^{-2}$). The dislocations 404*a*, 404*b* may be misfit dislocations 404*a* or threading dislocations 404*b*. The dislocations 404*a*, 404*b* may be formed when the top layer 302 is grown beyond a critical thickness of the top layer 302.

The critical thickness may again be defined by the composition of the sacrificial intermediate layer 104. As described above, the critical thickness of the top layer 302 may decrease as the difference between the lattice constants of the sacrificial intermediate layer 104 and the top layer 302 increases. The growth temperature of the top layer 302 may also affect the critical thickness of the top layer 302. When the thickness of the top layer 302 is below the critical thickness, the top layer 302 may remain strained to conform the lattice structure of the top layer 302 to the lattice structure of the sacrificial intermediate layer 104. In other words, the top layer 302 may include residual strain throughout the top layer 302 as molecular forces in the sacrificial intermediate layer 104 force the lattice structure of the top layer 302 to conform to the lattice structure of the sacrificial intermediate layer 104. Once the top layer 302 is grown beyond the critical thickness, dislocations 404*a*, 404*b* may begin to form throughout the top layer 302 relaxing the residual strain in the top layer 302 and allowing the lattice structure in the top layer 302 to grow without conforming to the lattice structure of the sacrificial intermediate layer 104.

Relaxing the top layer 302 may form dislocations 404*a* along an interface 402 between the top layer 302 and the top surface 108 of the sacrificial intermediate layer 104. The dislocations 404*a* may be misfit dislocations, such as missing or dangling bonds at the interface 402 between the top layer 302 and the sacrificial intermediate layer 104. For each misfit dislocation 404*a* there may be at least two threading dislocations 404*b* extending through the top layer 302 to the top surface 304 of the top layer 302.

As described above, releasing the residual strain caused by conforming the lattice of the top layer 302 to the sacrificial intermediate layer 104 may substantially increase deformations in the top surface 304 of the top layer 302 resulting in increasing surface roughness. In some cases, the surface roughness may be sufficiently low to eliminate the process of polishing the top surface 304 of the top layer 302.

In some embodiments, the top layer 302 may be formed in multiple layers similar to the sacrificial intermediate layer 104. For example, a first layer may be formed until the desired dislocations 404*a*, 404*b* are formed. A second layer of the top layer 302 may then be formed over the first layer. The second layer may have substantially lower dislocation density 404*a*, 404*b*. The second layer may be configured to substantially trap the dislocations 404*b* in the first layer. Another high growth rate layer may be grown at a high temperature. The high growth rate layer may provide a smooth surface and may also have a substantially low concentration of dislocations 404*a*, 404*b*. The layer(s) of the top layer 302 may be grown at a temperature higher than the temperatures at which the sacrificial intermediate layer 104 was grown. For example, the top layer 302 may be grown at between about 900° C. and about 1200° C., such as about 1000° C.

In some embodiments, the top layer 302 may go through an annealing process. For example, the top layer 302 may go through one or more anneal cycles. The anneal cycles may substantially reduce the dislocations 404*a*, 404*b* by providing thermal energy for the dislocations to propagate.

Figure 4B:
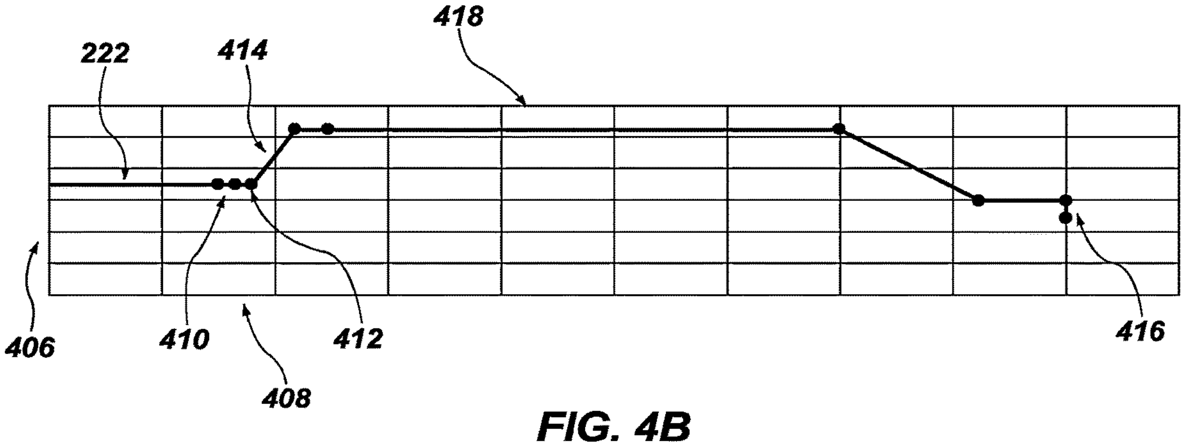

FIG. 4B illustrates a graph of the temperature 406 over time 408 representative of a process of forming the top layer 302. After the third layer 222 of the sacrificial intermediate layer 104 is grown, the tooling may go through a purge 410 process and a backfill 412 process at substantially the same temperature as the growing temperature of the third layer 222. The purge 410 and backfill 412 processes may prepare the tooling for growing the top layer 302. The temperature 406 may then rise 414 to a growing temperature for the top layer 302. As described above, the growing temperature for the top layer 302 may be between about 900° C. and about 1200° C., such as between about 1000° C. and about 1100° C., or about 1050° C.

A deposition 418 process may be used to form the top layer 302 over a period of time. The period of time may be between about 700 s and about 1200 s, such as between about 800 s and about 1000 s, or about 900 s. In some embodiments, the deposition 418 process may include multiple deposition 418 processes. For example, the deposition 418 process may be split into multiple processes similar to the sacrificial intermediate layer 104, which is formed in a first layer 216, second layer 220, and third layer 222 as described above. In some embodiments, the deposition 418 may be performed at multiple different temperatures, such as a first, temperature and a second temperature and the period of time may be split between the multiple deposition 418 processes.

Figure 4C:
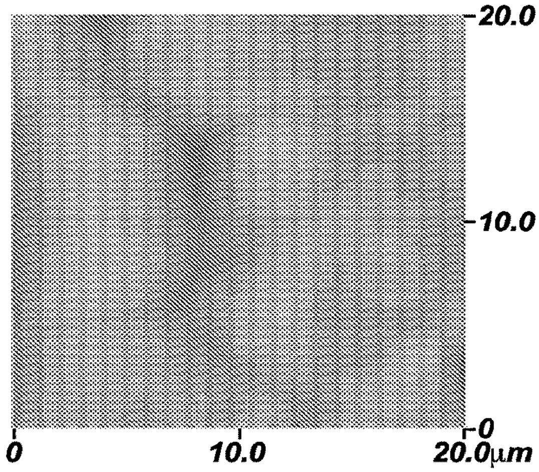

FIG. 4C illustrates an Atomic Force Microscopy (AFM) image of a top surface of the top surface 304 of the top layer 302 after the top layer 302 has been formed. The surface may have a maximum elevation change of less than about 30 nm, such as less than about 20 nm, or less than about 15 nm. The surface may have an RMS roughness of less than about 10 nm, such as less than about 5 nm, or less than about 2 nm.

Figure 5:
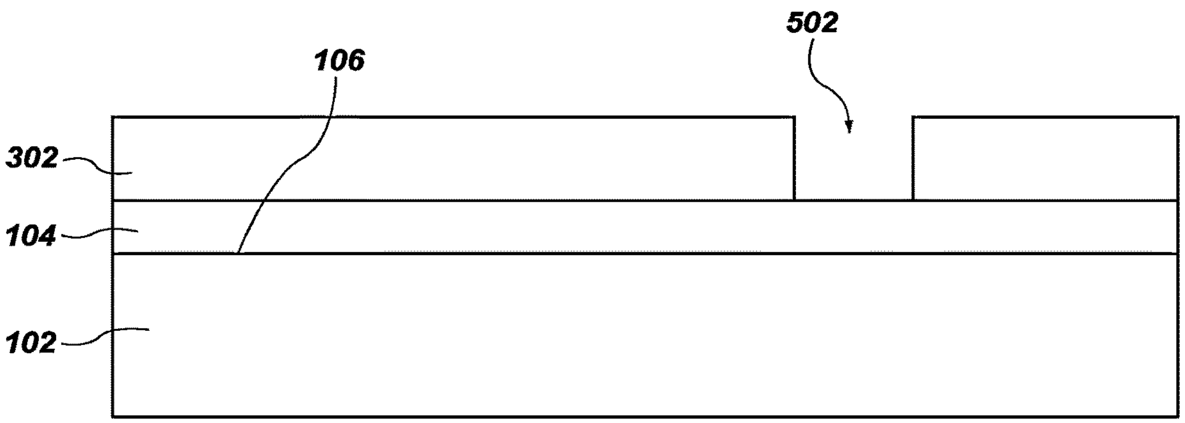
FIGS. 5 and 6 illustrate schematic views of process steps of forming a free-standing microstructure from the engineered substrate of FIGS. 1-4C in accordance with embodiments of the present disclosure.

After the top layer 302 is formed and relaxed an opening 502 may be formed through at least the top layer 302 and partially through the sacrificial intermediate layer 104, as illustrated in FIG. 5. The opening 502 may be formed to provide access to the sacrificial intermediate layer 104 through the top layer 302. The opening 502 may be formed through a material process, such as etching (e.g., wet etching, chemical etching, dry etching, ion etching, etc.), laser material removal, etc.

The material may be removed up to at least the top surface 106 of the base substrate 102, such that the opening 502 forms a recess extending completely through the top layer 302 and the sacrificial intermediate layer 104 ending at the top surface 106 of the base substrate 102. In some embodiments, the opening 502 may not extend completely through the sacrificial intermediate layer 104. For example, a bottom surface of the opening 502 may be positioned within the sacrificial intermediate layer 104. In other embodiments, the opening 502 may extend into the base substrate 102.

Figure 6:
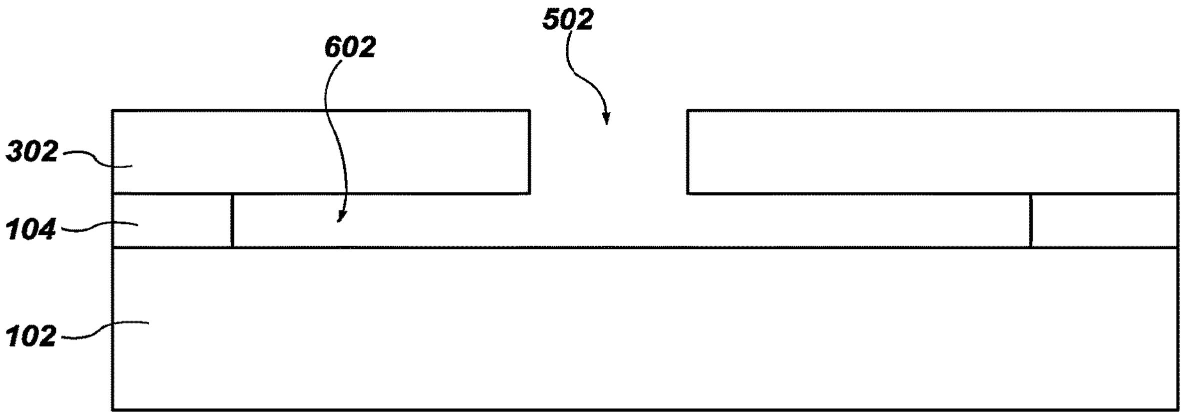

After forming the opening 502, a selective material removal process may be used to remove at least a portion of the sacrificial intermediate layer 104, as illustrated in FIG. 6. The sacrificial intermediate layer 104 may be selectively removed through a process, such as selective etching. For example, if the sacrificial intermediate layer 104 is formed from SiGe and the base substrate 102 and the top layer 302 each are formed from silicon, an etching process, such as a Hydrogen Chloride (HCl) etch (e.g., HCl vapor etch or HCl liquid chemical etch) or a Hydrogen Fluoride (HF) acetic acid etch, may remove the SiGe while not removing a substantial amount of material from the adjoining silicon base substrate 102 and silicon top layer 302. The use of an HF acetic acid etch for the selective removal of SiGe is described in B. Hollaander, et al., Wet Chemical Etching Of Si, $Si_{1-x}Ge_x$, and Ge In $HF:H_2O_2:CH_3COOH$, Journal Of The Electrochemical Society, 157 (6), H643-H646, (Apr. 23, 2010), the disclosure of which is incorporated herein in its entirety by this reference.

The sacrificial intermediate layer 104 may be exposed to the selective etch through the opening 502. For example, a vapor or chemical liquid may be inserted or directed through the opening 502 to remove the sacrificial intermediate layer 104 between the base substrate 102 and the top layer 302. The amount of sacrificial intermediate layer 104 removed by the selective etch may be controlled by the amount of time that the sacrificial intermediate layer 104 is exposed to the selective etch chemical. For example, an etch rate of the selective etch may be known for the material of the sacrificial intermediate layer 104, such that the amount of material removed may be controlled by controlling the time that the sacrificial intermediate layer 104 is exposed to the selective etch in reference to the etch rate. Factors of the sacrificial intermediate layer 104 and etching process that may affect the etch rate are described in more detail below with respect to FIG. 7.

After a portion of the sacrificial intermediate layer 104 is removed a void 602 may remain between the top layer 302 and the base substrate 102, resulting in a free-standing microstructure of the top layer 302 floating over the base substrate 102. As illustrated in FIG. 6, the free-standing microstructure may be a cantilever beam of the top layer 302 supported on one end by a remaining portion of the sacrificial intermediate layer 104 over the void 602 to the opening 502. In other embodiments, a greater amount of the sacrificial intermediate layer 104 may be removed, such as substantially the entire sacrificial intermediate layer 104, such that the top layer 302 forms a membrane separated from the base substrate 102 by the void 602 where the sacrificial intermediate layer 104 was removed.

As described above, the layers 104, 302 may be substantially free from residual strain. The resulting free-standing microstructure may therefore be substantially free of residual strain. A free-standing microstructure free from residual strain may allow the mechanical behavior of a related electronic device to be controlled without compensating for residual strain in the free-standing microstructure. For example, sensors formed with microstructures substantially free of residual strain may have greater sensitivity or accuracy.

Figure 7:
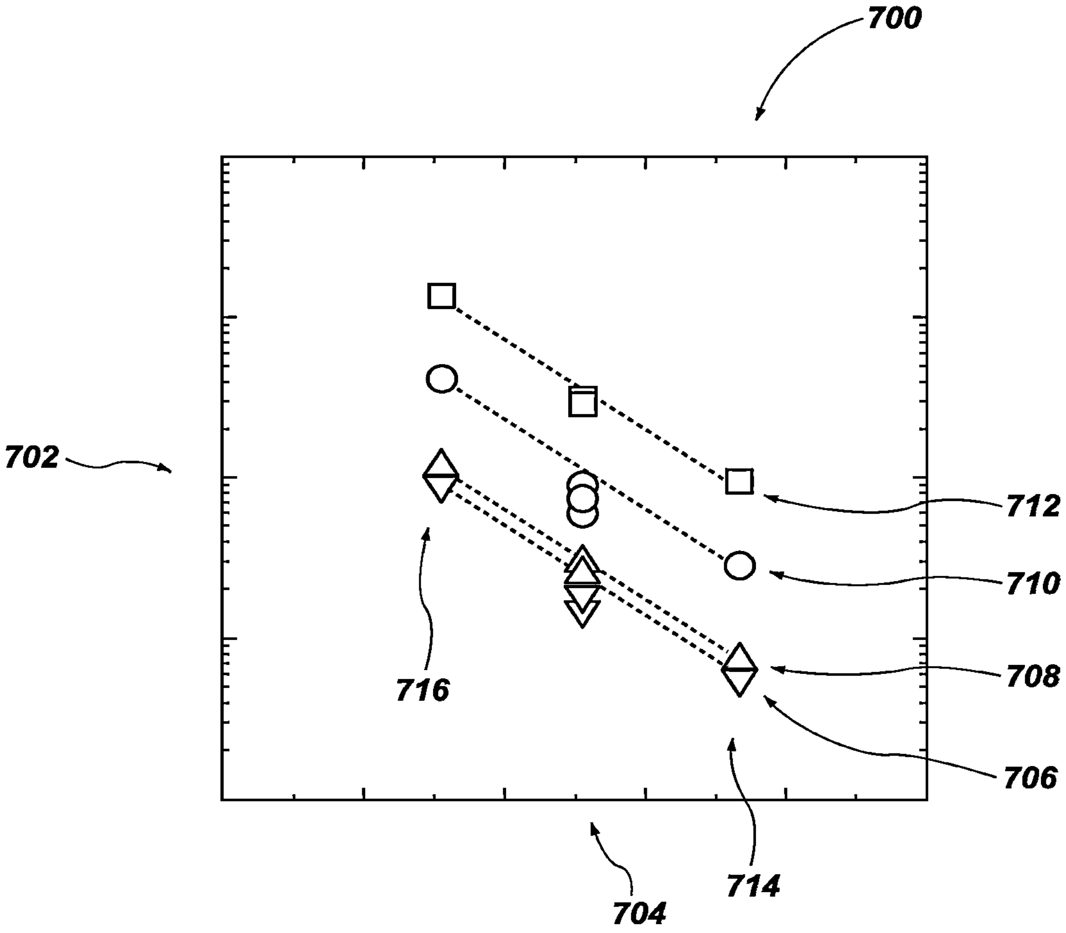
FIG. 7 illustrates a plot of an etching rate at different temperatures for different material compositions in accordance with one or more embodiments of the present disclosure.

FIG. 7 illustrates a plot 700 of different etch rates 702 for different compositions 706, 708, 710, 712 of the sacrificial intermediate layer 104 at different temperatures 704. The etch rate 702 may be defined as a distance over a time, such as nanometers/second, m/second, etc. The temperature 704 may be an inverse of the temperature 704 (e.g., 1/temperature), such that an increase in temperature results in a smaller value on the plot 700. For example, a first temperature 714 may be less than a second temperature 716. Thus, as illustrated in the plot 700, as the temperature 704 increases the etch rate 702 may also increase.

The compositions 706, 708, 710, 712 may indicate an increase in concentration of an element of the composition. As described above, the sacrificial intermediate layer 104 may be formed from a silicon- or germanium-based material, such as SiGe. A first composition 706 may represent pure silicon, such as the material used for the base substrate 102 and/or the top layer 302. The second composition 708 may represent an etch rate 702 for a silicon- or germanium-based material having a small concentration (e.g., between about 0% and about 10%) of the additional element, such as Ge. The third composition 710 may represent an etch rate 702 for the silicon- or germanium-based material having a greater concentration (e.g., between about 10% and about 20%) of the additional element. The fourth composition 712 may represent an etch rate 702 for the silicon- or germanium-based material having an even greater concentration (e.g., between about 20% and about 30%) of the additional element. Thus, as the concentration of the additional element increases the etch rate 702 may also increase.

If the base substrate 102 and the top layer 302 are formed from silicon and the sacrificial intermediate layer 104 is formed from an SiGe material, increasing a concentration of the Ge in the SiGe material may enable a greater amount of the sacrificial intermediate layer 104 to be removed without removing a substantial amount of the silicon from the base substrate 102 and the top layer 302.

Figure 8:
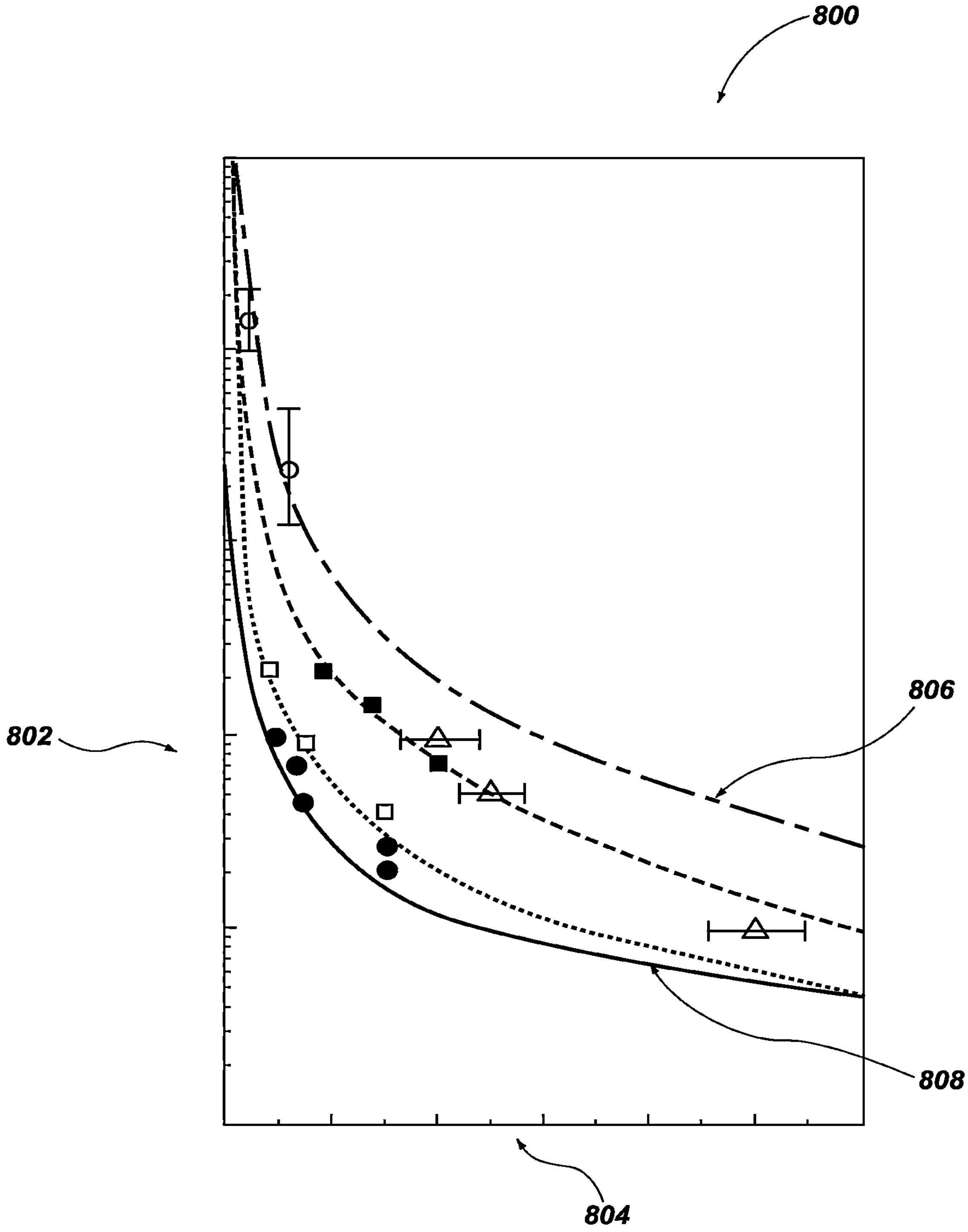
FIG. 8 illustrates a plot of a critical thickness at different temperatures for different material compositions in accordance with one or more embodiments of the present disclosure.

FIG. 8 illustrates a plot 800 representative of a critical thickness 802 for various compositions of the sacrificial intermediate layer 104 when the intermediate layer comprises SiGe. The plot 800 also illustrates the effect that temperature has on the critical thickness 802 of the different compositions of the sacrificial intermediate layer 104. The individual curves illustrated on the plot 800 each represent a different deposition temperature. The top curve 806 may be the lowest deposition temperature (e.g., 500° C.) and the bottom curve 808 may be the highest deposition temperature (e.g., 900° C.). The X axis represents Germanium concentration in the SiGe ranging between 0% (on the left) and 60% (on the right). The Y axis represents the layer thickness in nanometers on a logarithmic scale. Thus, as illustrated in the plot 800, the critical thickness may decrease as the deposition temperature increases.

As discussed above, the critical thickness 802 may be driven by a difference in the lattice constants of the base substrate 102 or the top layer 302 and the sacrificial intermediate layer 104. During a heterogeneous epitaxial deposition process (e.g., growing a material over a different material with a different lattice constant), the lattice structure of the material being deposited or grown may conform to the lattice structure of the base material until the critical thickness 802 is reached. The critical thickness 802 may be the thickness where the strain induced by conforming the lattice structure of the growing material is greater than the strain that the material can sustain, such that the dislocations form and propagate through the material so as to relieve the strain. As the difference between the respective lattice constants increases, the strain induced to conform the lattice constants may also increase. Therefore, a greater difference in the lattice constants may result in a reduction in the critical thickness 802, at least because the strain limit of the material may be reached earlier in the growth cycle.

As described above, the sacrificial intermediate layer 104 may be a silicon- or germanium-based material, such as SiGe. Where the base substrate 102 and/or the top layer 302 are formed from silicon, the difference between the lattice structure of the silicon- or germanium-based material of the sacrificial intermediate layer 104 and the silicon base substrate 102 and/or top layer 302 may be related to a concentration 804 of the additional element in the silicon- or germanium-based material. As a concentration 804 of the additional material increases, the lattice parameter may increase or decrease depending on the addition material. For example, as a concentration 804 of Ge in SiGe increases, the lattice parameter also increases. Thus, as a concentration 804 of the additional element in the sacrificial intermediate layer 104 increases, the difference between the lattice constants may also increase resulting in a reduction in the critical thickness 802.

In some embodiments, the lattice constants of adjoining materials may differ by as much as 5%, such as about 4.2%. Large differences between the lattice constants may result in critical thicknesses of less than about 10 nanometers (nm), such as less than about 5 nm, or even less than about 1 nm.

Embodiments of the present disclosure may result in engineered substrates having substantially smooth surfaces without the need for additional polishing steps. Removing additional polishing steps may reduce the cost of producing the resulting devices at least due to reduced manufacture time, the elimination of additional equipment, and eliminating additional process steps.

Embodiments of the present disclosure may also result in free-standing microstructures that are substantially free of residual strain from the manufacturing process. Free-standing microstructures that are substantially free of residual strain may be more sensitive to control in the resulting electronic device. For example, a sensor including one or more free-standing microstructures of the present disclosure may have greater sensitivity and/or accuracy.

The following examples serve to explain embodiments of the disclosure in more detail. These examples are not to be construed as being exhaustive or exclusive as to the scope of the disclosure.

The embodiments of the disclosure described above and illustrated in the accompanying drawing figures do not limit the scope of the invention, since these embodiments are merely examples of embodiments of the invention, which is defined by the appended claims and their legal equivalents. Any equivalent embodiments are intended to be within the scope of this disclosure. Indeed, various modifications of the present disclosure, in addition to those shown and described herein, such as alternative useful combinations of the elements described, may become apparent to those skilled in the art from the description. Such modifications and embodiments are also intended to fall within the scope of the appended claims and their legal equivalents.

What is claimed is:

1. An engineered substrate, comprising:

a base substrate;

a monocrystalline sacrificial intermediate layer epitaxially grown over the base substrate;

wherein a composition of said monocrystalline sacrificial intermediate layer varies across a thickness of the monocrystalline sacrificial intermediate layer;

wherein the monocrystalline sacrificial intermediate layer comprises a silicon-germanium ($Si_{1-x}Ge_x$) layer, wherein x denotes a mole fraction of germanium and wherein a value of x is within a range from 0.3 to 0.7;

wherein the monocrystalline sacrificial intermediate layer comprises a stack of epitaxially grown sublayers and includes a first sublayer and at least a second sublayer formed over the first sublayer, the at least the second sublayer having a lower density of dislocations than the first sublayer;

and a monocrystalline top layer epitaxially grown over the monocrystalline sacrificial intermediate layer.

2. The engineered substrate of claim 1, wherein the base substrate comprises a silicon substrate.

3. The engineered substrate of claim 2, wherein a minimum mole fraction of germanium of the $Si_{1-x}Ge_x$ of the monocrystalline sacrificial intermediate layer is sufficient to cause the monocrystalline sacrificial intermediate layer to be etched at an etch rate that is higher than those of the silicon substrate and the monocrystalline top layer.

4. The engineered substrate of claim 3, wherein the monocrystalline sacrificial intermediate layer has a thickness greater than a critical thickness of the $Si_{1-x}Ge_x$ corresponding to a chosen value of x.

5. The engineered substrate of claim 1, wherein a material of at least one of the monocrystalline sacrificial intermediate layer and the monocrystalline top layer is a relaxed material at least substantially free of residual strain.

6. The engineered substrate of claim 5, wherein the at least one of the monocrystalline sacrificial intermediate layer and the monocrystalline top layer includes a plurality of dislocations.

7. The engineered substrate of claim 6, wherein the plurality of dislocations in the at least one of the monocrystalline sacrificial intermediate layer and the monocrystalline top layer has a density of less than $10^9$ $cm^{-2}$.

8. The engineered substrate of claim 1, wherein both the monocrystalline sacrificial intermediate layer and the monocrystalline top layer are relaxed and substantially free of residual strain.

9. The engineered substrate of claim 1, wherein an exposed surface of the monocrystalline top layer has an RMS surface roughness of less than 10 nm.

10. The engineered substrate of claim 1, wherein the monocrystalline top layer has a thickness greater than a critical thickness of the monocrystalline top layer.

11. The engineered substrate of claim 1, wherein the composition of the monocrystalline sacrificial intermediate layer varies continuously across the thickness of the monocrystalline sacrificial intermediate layer.

12. The engineered substrate of claim 1, wherein the monocrystalline sacrificial intermediate layer comprises a plurality of sublayers, each sublayer of the plurality having a composition or a composition profile that differs, respectively, from compositions or composition profiles of immediately adjacent sublayers of the plurality such that a composition of the monocrystalline sacrificial intermediate layer varies discontinuously across the thickness of the monocrystalline sacrificial intermediate layer.

13. The engineered substrate of claim 1, further comprising one or more voids in the monocrystalline sacrificial intermediate layer.

14. A free-standing microstructure, comprising:

a base silicon substrate;

a monocrystalline sacrificial intermediate germanium-silicon ($Si_{1-x}Ge_x$) layer epitaxially grown over the base silicon substrate, wherein x denotes a mole fraction of germanium with a value within a range from 0.3 and 0.7, and wherein a value of x varies across a thickness of the monocrystalline sacrificial intermediate $Si_{1-x}Ge_x$ layer;

wherein the monocrystalline sacrificial intermediate layer comprises a stack of epitaxially grown sublayers and includes a first sublayer and at least a second sublayer formed over the first sublayer, the at least the second sublayer having a lower density of dislocations than the first sublayer;

and a monocrystalline silicon layer epitaxially grown on the monocrystalline sacrificial intermediate $Si_{1-x}Ge_x$ layer;

wherein one or more voids are present in the monocrystalline sacrificial intermediate $Si_{1-x}Ge_x$ layer directly between the base silicon substrate and the monocrystalline silicon layer.

15. The free-standing microstructure of claim 14, wherein an exposed surface of the monocrystalline silicon layer has an RMS surface roughness of less than 10 nm.

16. The free-standing microstructure of claim 14, wherein a composition of the monocrystalline sacrificial intermediate $Si_{1-x}Ge_x$ layer varies continuously across the thickness of the monocrystalline sacrificial intermediate $Si_{1-x}Ge_x$ layer.

17. The free-standing microstructure of claim 14, wherein the monocrystalline sacrificial intermediate $Si_{1-x}Ge_x$ layer comprises a plurality of sublayers, each sublayer of the plurality having a composition or a composition profile that differs, respectively, from compositions or composition profiles of immediately adjacent sublayers of the plurality such that a composition of the monocrystalline sacrificial intermediate $Si_{1-x}Ge_x$ layer varies discontinuously across the thickness of the monocrystalline sacrificial intermediate $Si_{1-x}Ge_x$ layer.

* * * * *